US012580583B2

(12) United States Patent
Shen et al.

(10) Patent No.: US 12,580,583 B2
(45) Date of Patent: Mar. 17, 2026

(54) DIFFERENTIAL SUCCESSIVE APPROXIMATION REGISTER ANALOG-TO-DIGITAL CONVERTER WITH DYNAMIC INPUT COMMON-MODE VOLTAGE CONTROL AND ASSOCIATED METHOD

(71) Applicant: Airoha Technology Corp., Hsinchu City (TW)

(72) Inventors: Wei-Chen Shen, Hsinchu City (TW); Tzung-Hung Kang, Kaohsiung City (TW)

(73) Assignee: Airoha Technology Corp., Hsinchu City (TW)

(*) Notice: Subject to any disclaimer, the term of this patent is extended or adjusted under 35 U.S.C. 154(b) by 85 days.

(21) Appl. No.: 18/673,343

(22) Filed: May 24, 2024

(65) Prior Publication Data

US 2025/0365004 A1    Nov. 27, 2025

(51) Int. Cl.
H03M 3/00        (2006.01)
H03M 3/04        (2006.01)

(52) U.S. Cl.
CPC .................................... H03M 3/04 (2013.01)

(58) Field of Classification Search
CPC ...................................................... H03M 3/04
USPC .......................................................... 341/143
See application file for complete search history.

(56) References Cited

U.S. PATENT DOCUMENTS

| | | | | |
|---|---|---|---|---|
| 10,630,310 | B1* | 4/2020 | Litjes ..................... | H03M 1/462 |
| 10,715,163 | B2* | 7/2020 | Chao ................... | H03M 1/1033 |
| 2013/0044014 | A1* | 2/2013 | Lin ...................... | H03M 1/1061 |
| | | | | 341/110 |
| 2015/0184981 | A1* | 7/2015 | Liu ........................ | F41H 5/0414 |
| | | | | 89/36.02 |
| 2023/0254607 | A1* | 8/2023 | Nakamoto ........... | H04N 25/618 |
| | | | | 348/207.99 |
| 2023/0318615 | A1* | 10/2023 | Gupta ................... | H03M 1/462 |
| | | | | 341/143 |
| 2023/0396264 | A1* | 12/2023 | Kumbaranthodiyil .. | H03M 1/72 |
| 2024/0275398 | A1* | 8/2024 | Gu ......................... | H03M 1/468 |

FOREIGN PATENT DOCUMENTS

CN        114978177 A      8/2022

* cited by examiner

*Primary Examiner* — Jean B Jeanglaude
(74) *Attorney, Agent, or Firm* — Winston Hsu

(57)        ABSTRACT

A differential successive approximation register (SAR) analog-to-digital converter (ADC) includes a comparator circuit, a sampling circuit, a first capacitive digital-to-analog converter (DAC), a second capacitive DAC, a SAR logic circuit, and a common-mode voltage control circuit. The sampling circuit samples a differential voltage input to generate and output a differential comparator input to the comparator circuit during a sample phase of the differential SAR ADC. The first and second capacitive DACs are coupled to a non-inverting input terminal and an inverting input terminal of the comparator circuit, respectively. The SAR logic circuit controls the first and second capacitive DACs during a SAR phase of the differential SAR ADC. The common-mode voltage control circuit dynamically adjusts an input common-mode voltage of the comparator circuit, wherein the input common-mode voltage of the comparator circuit has different voltage levels during the sample phase and the SAR phase.

14 Claims, 6 Drawing Sheets

DIFFERENTIAL SUCCESSIVE APPROXIMATION REGISTER ANALOG-TO-DIGITAL CONVERTER WITH DYNAMIC INPUT COMMON-MODE VOLTAGE CONTROL AND ASSOCIATED METHOD

BACKGROUND OF THE INVENTION

1. Field of the Invention

The present invention relates to analog-to-digital conversion, and more particularly, to a differential successive approximation register (SAR) analog-to-digital converter (ADC) with dynamic input common-mode voltage control and an associated method.

2. Description of the Prior Art

With advances in complementary metal-oxide-semiconductor (CMOS) technology, SAR ADCs have received attention due to their excellent power efficiency and area efficiency. Thus, SAR ADCs are widely adopted in many applications. In these applications, SAR ADCs are often integrated with other circuit components in a system-on-chip (SoC) environment. To meet the low-power requirements of SoCs, various techniques have been proposed to reduce the power consumption of SAR ADCs. Lowering the supply voltage of a chip is an intuitive approach to achieve low power consumption, but it will confront the inevitable problem of low signal swing. When a typical SAR ADC is used by a low-power application with a low supply voltage, the typical SAR ADC may fail to work normally under the low supply voltage.

SUMMARY OF THE INVENTION

One of the objectives of the claimed invention is to provide a differential SAR ADC with dynamic input common-mode voltage control and an associated method.

According to a first aspect of the present invention, an exemplary differential successive approximation register (SAR) analog-to-digital converter (ADC) is disclosed. The differential SAR ADC includes a comparator circuit, a sampling circuit, a first capacitive digital-to-analog converter (DAC), a second capacitive DAC, a SAR logic circuit, and a common-mode voltage control circuit. The comparator circuit has a non-inverting input terminal and an inverting input terminal. The sampling circuit is arranged to sample a differential voltage input to generate and output a differential comparator input to the comparator circuit during a sample phase of the differential SAR ADC. The first capacitive DAC is coupled to the non-inverting input terminal of the comparator circuit. The second capacitive DAC is coupled to the inverting input terminal of the comparator circuit. The SAR logic circuit is arranged to control the first capacitive DAC and the second capacitive DAC during a SAR phase of the differential SAR ADC. The common-mode voltage control circuit is arranged to dynamically adjust an input common-mode voltage of the comparator circuit, wherein the input common-mode voltage of the comparator circuit has a first voltage level during the sample phase and a second voltage level during the SAR phase, and the second voltage level is different from the first voltage level.

According to a second aspect of the present invention, an exemplary differential successive approximation register (SAR) analog-to-digital conversion method is disclosed. The exemplary SAR analog-to-digital conversion method includes: during a sample phase of a differential SAR analog-to-digital conversion operation, sampling a differential voltage input to generate and output a differential comparator input to a comparator circuit that has a non-inverting input terminal and an inverting input terminal, and setting an input common-mode voltage of the comparator circuit by a first voltage level; and during a SAR phase of the differential SAR analog-to-digital conversion operation, controlling a first capacitive digital-to-analog converter (DAC) that is coupled to the non-inverting input terminal of the comparator circuit and a second capacitive DAC that is coupled to the inverting input terminal of the comparator circuit, and adjusting the input common-mode voltage of the comparator circuit to have a second voltage level, wherein the second voltage level is different from the first voltage level.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
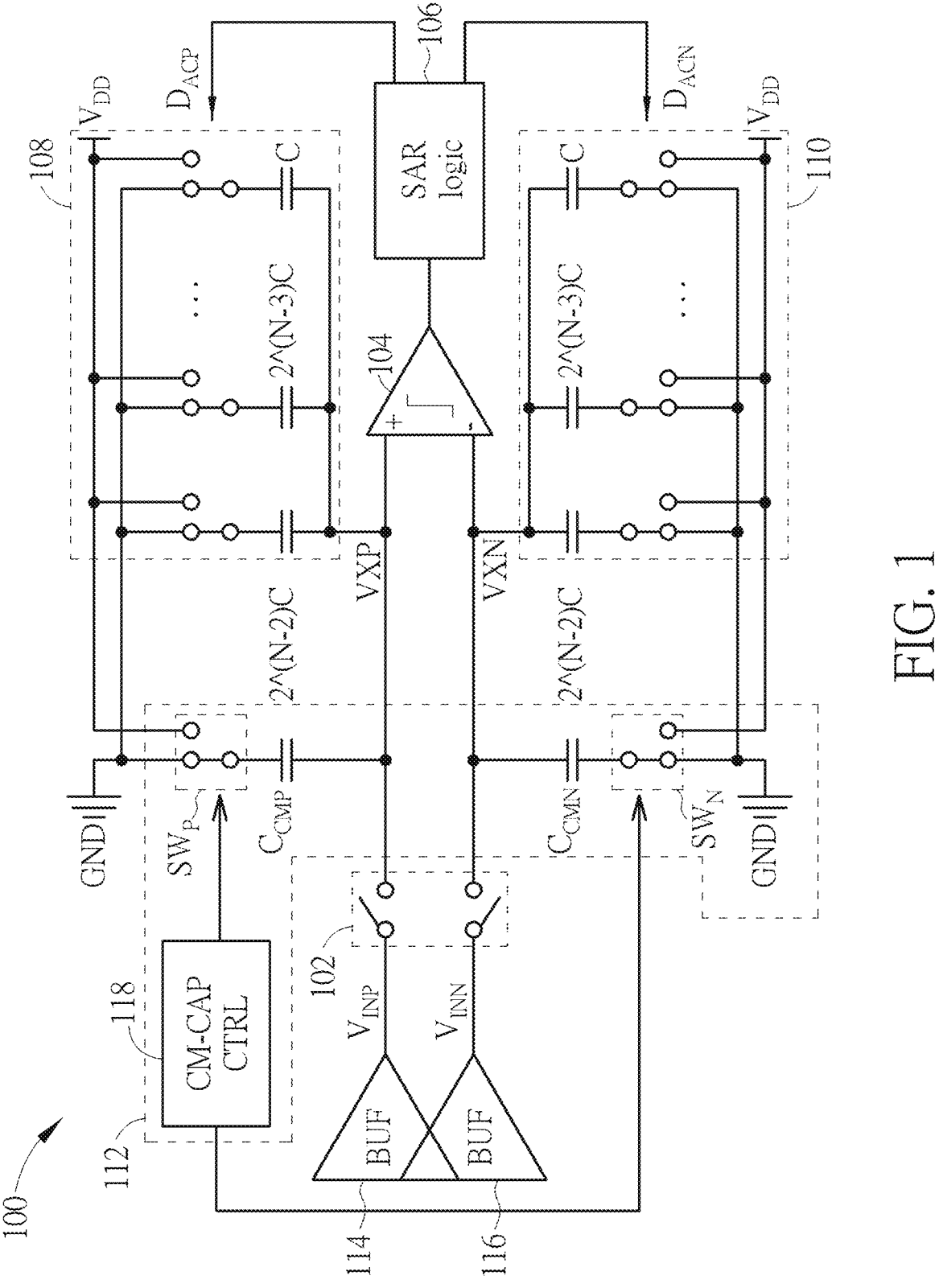
FIG. 1 is a diagram illustrating a differential SAR ADC according to an embodiment of the present invention.

FIG. 1 is a diagram illustrating a differential SAR ADC according to an embodiment of the present invention. The differential SAR ADC 100 includes a sampling circuit 102, a comparator circuit 104, a SAR logic circuit (labeled by "SAR logic") 106, a plurality of capacitive digital-to-analog-converters (DACs) 108, 110, a common-mode voltage control circuit 112, and a plurality of input buffers (labeled by "BUF") 114, 116. In this embodiment, the differential SAR ADC 100 is a top-plate sampling differential SAR ADC. Bottom-plate sampling and top-plate sampling are commonly used techniques for charge-redistribution SAR ADC. The difference between the two techniques is the connection of a sampling circuit (which is used to sample a voltage input to be converted into a digital value) to either the bottom plate or top plate of a capacitor array. Specifically, the top-plate sampling technique provides a sampled result of the voltage input to the top plate of the capacitor array that is connected to an input terminal of a comparator circuit, and the bottom-plate sampling technique provides a sampled result of the voltage input to the bottom plate of the capacitor array that is not connected to the input terminal of a comparator circuit. Compared to the differential bottom-plate sampling SAR ADC, the differential top-plate sampling SAR ADC has certain advantages such as smaller chip area and faster analog-to-digital conversion speed.

Since the differential SAR ADC 100 in this embodiment is a top-plate sampling differential SAR ADC, one SAR analog-to-digital conversion operation (i.e., generation of one digital value) includes a sample phase and a SAR phase. As shown in FIG. 1, the comparator circuit 104 has a non-inverting input terminal "+" and an inverting input terminal "−". The sampling circuit 102 is arranged to perform a track and hold (T/H) operation upon a differential voltage input ($V_{INP}$, $V_{INN}$) output from input buffers 114, 116. Specifically, the sampling circuit 102 is arranged to sample the differential voltage input ($V_{INP}$, $V_{INN}$) to generate and output a differential comparator input (VXP, VXN) to the comparator circuit 104 during a sample phase of the differential SAR ADC 100. After the sample phase is completed, the comparator circuit 104 is disconnected from the input buffers 114, 106, and the comparator circuit 104, the SAR logic circuit 106, and the capacitive DACs 108, 110 are jointly used to determine a digital value of a differential voltage (VXP-VXN) during the SAR phase.

As shown in FIG. 1, one capacitive DAC 108 is coupled to the non-inverting input terminal "+" of the comparator circuit 104, and another capacitive DAC 110 is coupled to the inverting input terminal "−" of the comparator circuit 104. Each of the capacitive DACs 108 and 110 includes a switched capacitor array. The SAR logic circuit 106 is arranged to control switched capacitor arrays of the capacitive DACs 108 and 110 during the SAR phase. Since the present invention is focused on the proposed dynamic input common-mode voltage control scheme and the principle of a SAR ADC (e.g., top-plate sampling SAR ADC) is known to those skilled in the art, further description of the SAR phase of the differential SAR ADC 100 is omitted here for brevity.

The difference between the differential SAR ADC 100 and a typical differential SAR ADC is that the differential SAR ADC 100 employs the proposed dynamic input common-mode voltage control scheme. In this embodiment, the common-mode voltage control circuit 112 is arranged to dynamically adjust an input common-mode voltage of the comparator circuit 104 (i.e., a common-mode voltage of the comparator input (VXP, VXN)), wherein the input common-mode voltage of the comparator circuit 104 has a first voltage level during the sample phase and a second voltage level during the SAR phase, and the second voltage level is different from the first voltage level.

For better comprehension of technical features of the present invention, the following assumes that two reference voltages are set by $V_{DD}$ and GND. However, these are for illustrative purposes only, and are not meant to be limitations of the present invention. In practice, reference voltages needed by the differential SAR ADC 100 may be adjusted, depending upon actual design considerations.

Figure 2:
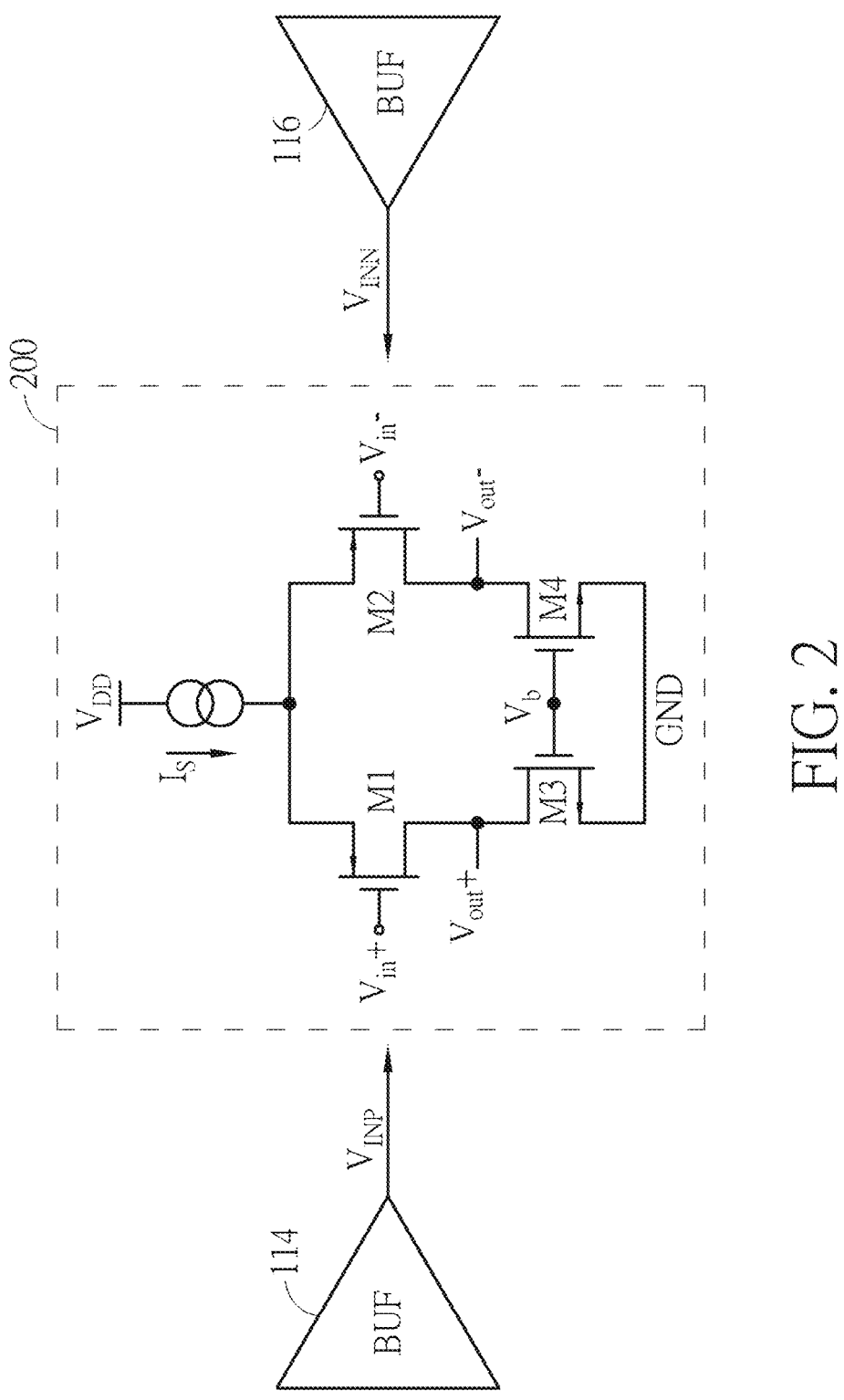
FIG. 2 is a circuit diagram of a comparator circuit according to an embodiment of the present invention.
Figure 3:
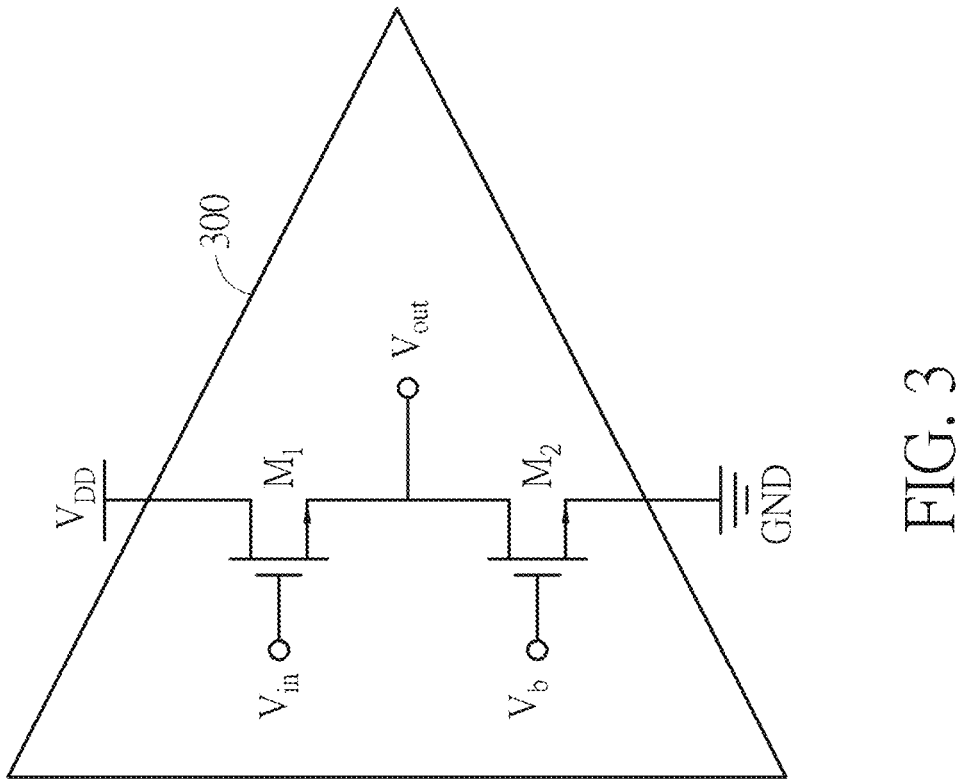
FIG. 3 is a circuit diagram of an input buffer according to an embodiment of the present invention.

To meet ADC's performance requirements, each of the input buffer output and the comparator input should be constrained to be within a safety operating range. For example, if the input buffer output is too low, the linearity of the input buffer becomes poorer. For another example, if the comparator input is too high, the analog-to-digital conversion speed becomes slower. FIG. 2 is a circuit diagram of a comparator circuit according to an embodiment of the present invention. FIG. 3 is a circuit diagram of an input buffer according to an embodiment of the present invention. The comparator circuit 104 shown in FIG. 1 may be implemented using the comparator circuit 200 shown in FIG. 2, and/or the input buffer 114/116 shown in FIG. 1 may be implemented using the input buffer 300 shown in FIG. 3.

As shown in FIG. 2, the comparator circuit 200 includes P-channel metal-oxide-semiconductor (PMOS) transistors M1, M2 and N-channel metal-oxide-semiconductor (NMOS) transistors M3, M4. The PMOS transistors M1, M2 act as input transistors of the comparator circuit 200. Hence, a differential input voltage ($V_{in}+$, $V_{in}-$) of the comparator circuit 200 is applied to gate terminals of the PMOS transistors M1, M2. In addition, a bias voltage $V_b$ is applied to gate terminals of the NMOS transistor M3, M4. A differential output voltage ($V_{out}+$, $V_{out}-$) of the comparator circuit 200 is generated at drain terminals of PMOS transistors M1, M2 and NMOS transistor M3, M4. To keep a normal operation of the comparator circuit 200, the input voltage $V_{in}+/V_{in}-$ needs to be low enough.

As shown in FIG. 3, the input buffer 300 has NMOS transistors $M_1$ and $M_2$, where an input voltage $V_{in}$ of the input buffer 300 is applied to a gate terminal of the NMOS transistor $M_1$, a bias voltage $V_b$ is applied to a gate terminal of the NMOS transistor $M_2$, and an output voltage $V_{out}$ of the input buffer 300 is generated at a source terminal of the NMOS transistor $M_1$ and a drain terminal of the NMOS transistor $M_2$. To keep a normal operation of the input buffer 300, the output voltage $V_{out}$ needs to be high enough.

As mentioned above, it is preferable that the comparator input voltage is high enough and the input buffer output voltage is low enough when the comparator circuit 200 and the input buffer 300 are used by a differential SAR ADC. If the supply voltage $V_{DD}$ is high enough, a safety operating range can be found to meet the requirements. However, when the differential SAR ADC is used by a low-power application using a low supply voltage, it is possible that there is no safety operating range that can be found to meet the requirements.

Figure 4:
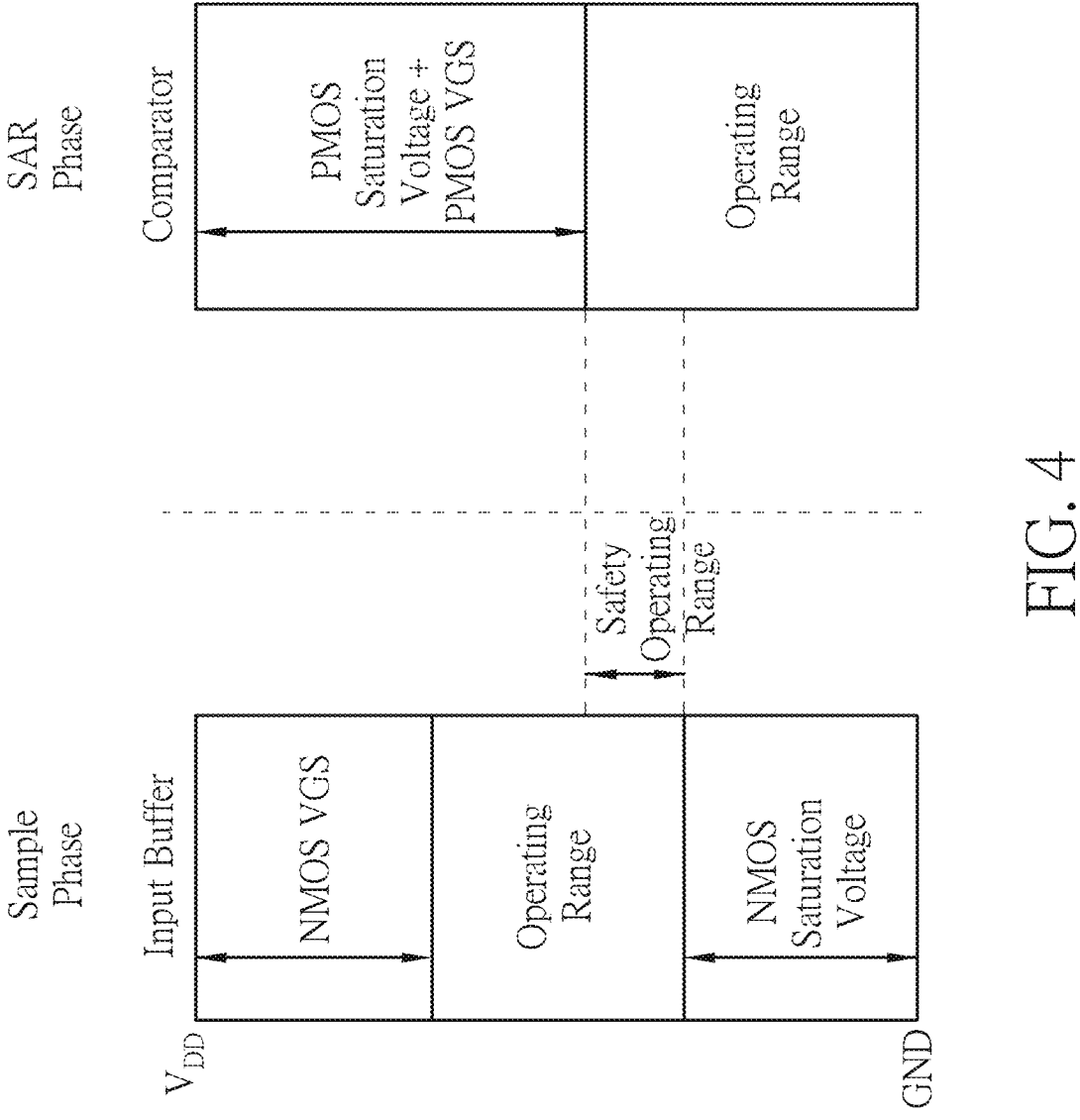
FIG. 4 is a diagram illustrating that a safety operating range is available to a SAR ADC operating under a high supply voltage.

FIG. 4 is a diagram illustrating that a safety operating range is available to a SAR ADC operating under a high supply voltage. The input buffer output during the sample phase should be constrained to be within an operating range, where an upper bound of the operating range is equal to (VDD−NMOS gate-to-source voltage (VGS)), and a lower bound of the operating range is equal to (NMOS saturation voltage−GND). The comparator input during the SAR phase should be constrained to be within an operating range, where an upper bound of the operating range is equal to [$V_{DD}$−(PMOS saturation voltage+PMOS gate-to-source voltage (VGS))], and a lower bound of the operating range is equal to GND. Since the supply voltage $V_{DD}$ is high, the sample-phase operating range overlaps the SAR-phase operating range, and a safety operating range can be set by an overlapped range of the sample-phase operating range and the SAR-phase operating range.

Figure 5:
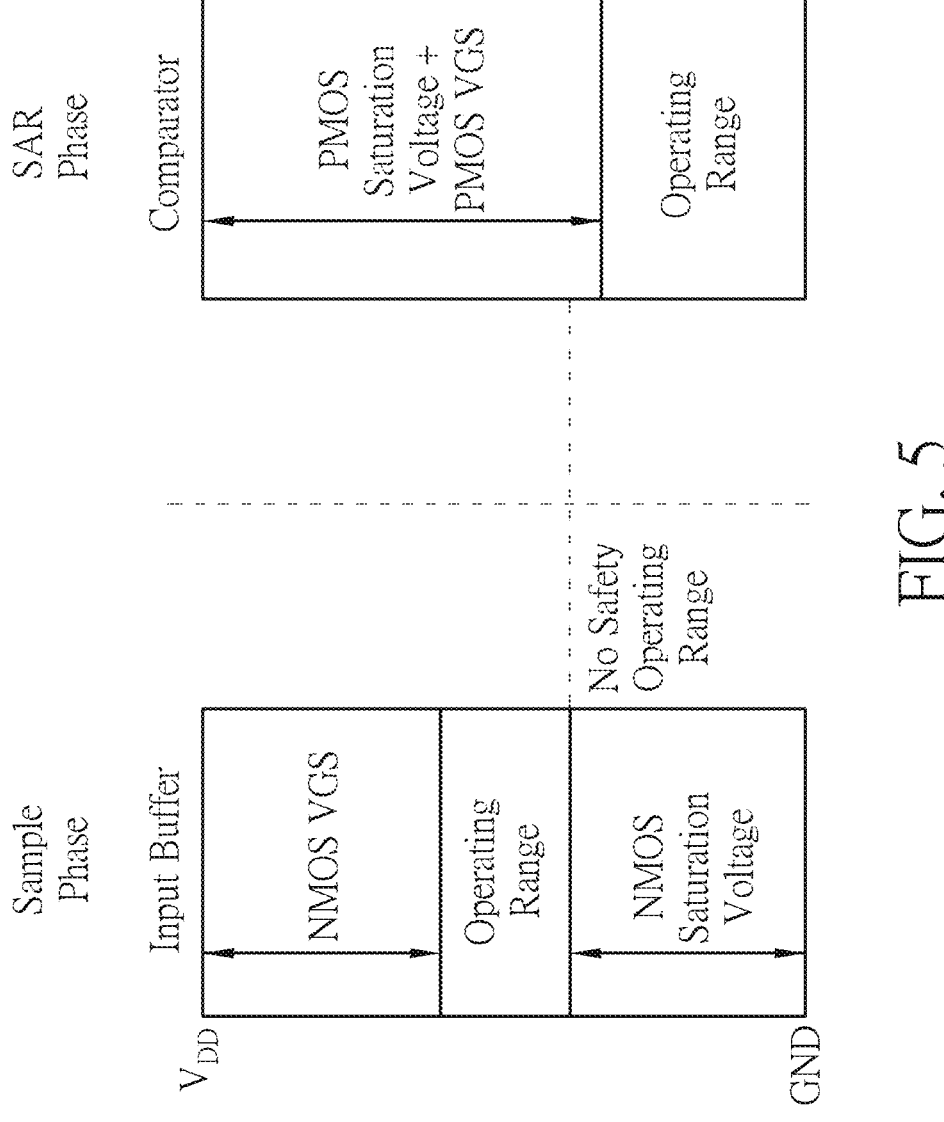
FIG. 5 is a diagram illustrating that no safety operating range is available to a SAR ADC operating under a low supply voltage.

FIG. 5 is a diagram illustrating that no safety operating range is available to a SAR ADC operating under a low supply voltage. The input buffer output during the sample phase should be constrained to be within an operating range, where an upper bound of the operating range is equal to ($V_{DD}$–NMOS VGS), and a lower bound of the operating range is equal to (NMOS saturation voltage–GND). The comparator input during the SAR phase should be constrained to be within an operating range, where an upper bound of the operating range is equal to [$V_{DD}$–(PMOS saturation voltage+PMOS VGS)], and a lower bound of the operating range is equal to GND. Since the supply voltage $V_{DD}$ is low, the sample-phase operating range does not overlap the SAR-phase operating range, and no overlapped range of the sample-phase operating range and the SAR-phase operating range can be used to set a safety operating range.

Figure 6:
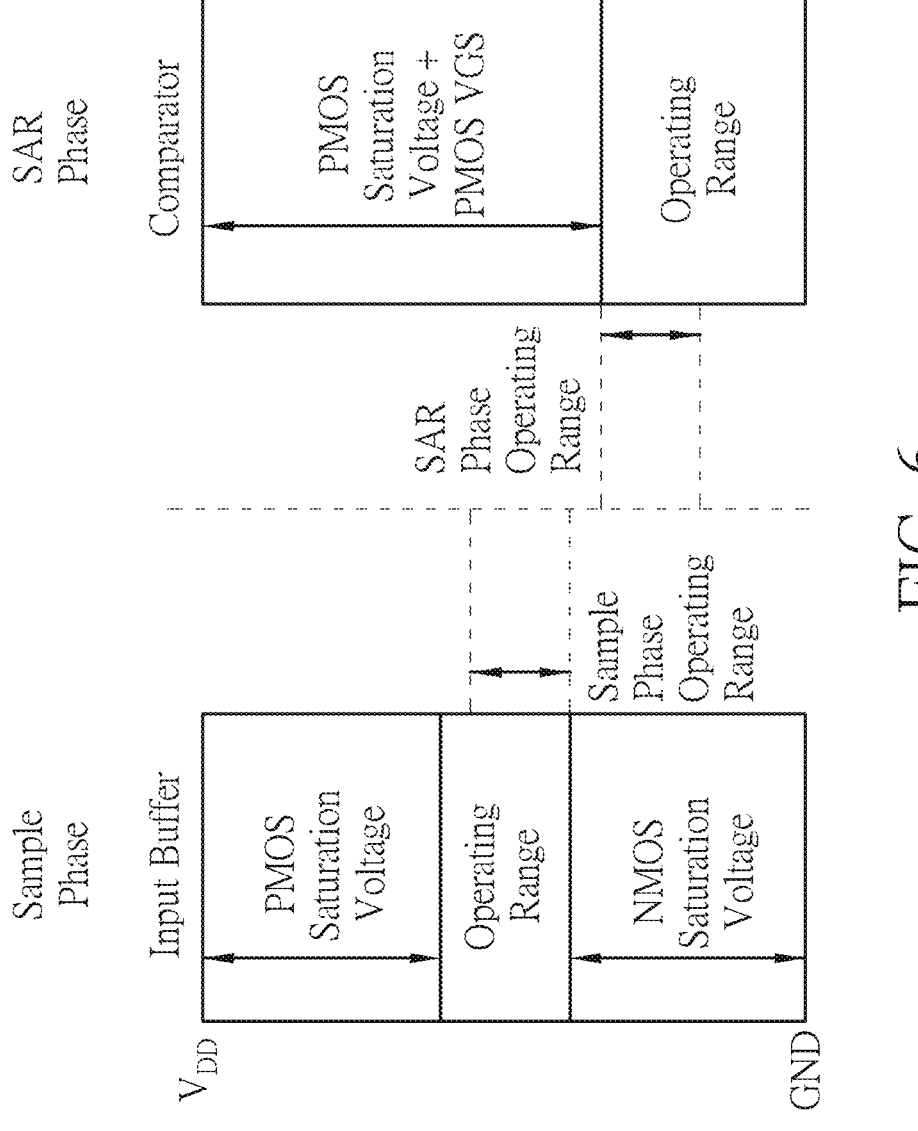
FIG. 6 is a diagram illustrating a SAR phase operating range and a sample phase operating range of a SAR ADC under a low supply voltage that are decoupled by the proposed dynamic input common-mode voltage control scheme.

To address the above issue encountered by a typical SAR ADC operating under a low supply voltage, the present invention proposes a dynamic input common-mode voltage control scheme for achieving an objective of decoupling a SAR-phase operating range from a sample-phase operating range, as illustrated in FIG. 6. In other words, the sample-phase common-mode voltage of the differential comparator input (VXP, VXN) (which depends on the common-mode voltage of the differential voltage input ($V_{INP}$, $V_{INN}$) that is sampled by the sampling circuit 102) is no longer inherited by the follow-up SAR phase. As shown in FIG. 6, the input buffer is allowed to operate under a sample-phase operating range during the sample phase in which the comparator circuit is connected to the input buffer, and the comparator circuit is allowed to operate under a SAR-phase operating range during the SAR phase in which the comparator circuit is disconnected from the input buffer, where the SAR-phase operating range does not overlap the sample-phase operating range.

As shown in FIG. 1, the common-mode voltage control circuit 112 includes a common-mode capacitor control logic circuit (labeled by "CM-CAP CTRL") 118, a plurality of common-mode capacitors $C_{CMP}$, $C_{CMN}$, and a plurality of switch circuits $SW_P$, $SW_N$. It should be noted that the common-mode capacitors $C_{CMP}$, $C_{CMN}$ are not parts of capacitor arrays included in the capacitive DACs 108 and 110, and the switch circuits $SW_P$, $SW_N$ are not controlled by the SAR logic circuit 106. The common-mode capacitor Comp has a first plate coupled to the non-inverting input terminal "+" of the comparator circuit, and a second plate selectively coupled to one of a plurality of reference voltages (e.g., supply voltage $V_{DD}$ and ground voltage GND) through the switch circuit $SW_P$. The common-mode capacitor $C_{CMN}$ has a first plate coupled to the inverting input terminal "–" of the comparator circuit, and a second plate selectively coupled to one of a plurality of reference voltages (e.g., supply voltage $V_{DD}$ and ground voltage GND) through the switch circuit $SW_N$.

The common-mode capacitor control logic circuit 118 is arranged to control configurations of the switch circuits $SW_P$ and $SW_N$ during the sample phase and the SAR phase of one SAR analog-to-digital conversion operation. In accordance with the proposed dynamic input common-mode voltage control scheme, the switch circuit $SW_P$ is arranged to couple the second plate of the common-mode capacitor $C_{CMP}$ to a first reference voltage VREF1 during the sample phase, and couple the second plate of the common-mode capacitor $C_{CMP}$ to a second reference voltage VREF2 during the SAR phase; and the switch circuit SWN is arranged to couple the second plate of the common-mode capacitor $C_{CMN}$ to the first reference voltage VREF1 during the sample phase, and couple the second plate of the common-mode capacitor $C_{CMN}$ to the second reference voltage VREF2 during the SAR phase, where the second reference voltage VREF2 is different from the first reference voltage VREF1 (i.e., VREF2≠VREF1). With the help of common-mode capacitors $C_{CMP}$ and $C_{CMN}$, the SAR-phase input common-mode voltage of the comparator circuit 104 is adjusted to be different from the sample-phase input common-mode voltage of the comparator circuit 104. The input common-mode voltage offset introduced by the common-mode capacitors $C_{CMP}$ and $C_{CMN}$ depends on capacitance values of the common-mode capacitors $C_{CMP}$ and $C_{CMN}$. In some embodiments of the present invention, the common-mode capacitors $C_{CMP}$ and $C_{CMN}$ may have the same capacitance value, and the capacitance value may be adjusted depending upon actual design considerations.

The settings of the first reference voltage VREF1 and the second reference voltage VREF2 depend on the actual hardware implementation of the differential SAR ADC 100. As mentioned above, the common-mode voltage control circuit 102 is used to make the input common-mode voltage of the comparator circuit 104 has a first voltage level during the sample phase and a second voltage level during the SAR phase, where the second voltage level is different from the first voltage level. Consider a case where the comparator circuit 104 shown in FIG. 1 is implemented using the comparator circuit 200 shown in FIG. 2, and each of the input buffers 114, 116 shown in FIG. 1 is implemented using the input buffer 300 shown in FIG. 3. Since input transistors of the comparator circuit 200 are PMOS transistors and transistors included in the input buffer 114/116 are NMOS transistors, the second voltage level during the SAR phase is adjusted by the common-mode voltage control circuit 102 to be lower than the first voltage level during the sample phase. In this way, the buffer linearity can be ensured due to the buffer output kept at a relatively high voltage level during the sample phase, and the analog-to-digital conversion speed can be increased due to the comparator input with a decreased common-mode voltage is at a lower voltage level during the SAR phase. To achieve the desired input common-mode voltage adjustment (particularly, decrement of input common-mode voltage) for the SAR phase, the first reference voltage VREF1 selected by the switch circuits $SW_P$, $SW_N$ during the sample phase may be set by a higher voltage such as the supply voltage $V_{DD}$, and the second reference voltage VREF2 selected by the switch circuits $SW_P$, $SW_N$ during the SAR phase may be set by a lower voltage such as the ground voltage GND (GND<$V_{DD}$). However, this is for illustrative purposes only, and is not meant to be a limitation of the present invention. In practice, the differential SAR ADC 100 has no limitations on implementation of the comparator circuit 104 and the input buffers 114, 116, and the common-mode voltage control circuit 102 can be used to properly adjust the input common-mode voltage of the comparator circuit 104 for achieving the objective of decoupling the SAR phase operating range from the sample phase operating range, which results in good buffer linearity during the sample phase and fast analog-to-digital conversion speed during the SAR phase.

Consider another case where the comparator circuit 104 shown in FIG. 1 is implemented using a comparator design different from that of the comparator circuit 200 shown in FIG. 2 and each of the input buffers 114, 116 shown in FIG. 1 is implemented using an input buffer design different from that of the input buffer 300 shown in FIG. 3. By way of example, but not limitation, the comparator design may have NMOS transistors acting as input transistors, and the input buffer design may be based on PMOS transistors. In this case, the second voltage level during the SAR phase may be adjusted by the common-mode voltage control circuit 102 to be higher than the first voltage level during the sample phase. To achieve the desired input common-mode voltage adjustment (particularly, increment of input common-mode voltage) for the SAR phase, the first reference voltage VREF1 selected by the switch circuits $SW_P$, $SW_N$ during the sample phase may be set by a lower voltage such as the ground voltage GND, and the second reference voltage VREF2 selected by the switch circuits $SW_P$, $SW_N$ during the SAR phase may be set by a higher voltage such as the supply voltage $V_{DD}$ ($V_{DD}$>GND). This alternative design also falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A differential successive approximation register (SAR) analog-to-digital converter (ADC), comprising:

a comparator circuit, having a non-inverting input terminal and an inverting input terminal;

a sampling circuit, arranged to sample a differential voltage input to generate and output a differential comparator input to the comparator circuit during a sample phase of the differential SAR ADC;

a first capacitive digital-to-analog converter (DAC), coupled to the non-inverting input terminal of the comparator circuit;

a second capacitive DAC, coupled to the inverting input terminal of the comparator circuit;

a SAR logic circuit, arranged to control the first capacitive DAC and the second capacitive DAC during a SAR phase of the differential SAR ADC; and a common-mode voltage control circuit, arranged to dynamically adjust an input common-mode voltage of the comparator circuit, wherein the input common-mode voltage of the comparator circuit has a first voltage level during the sample phase and a second voltage level during the SAR phase, and the second voltage level is different from the first voltage level.

2. The differential SAR ADC of claim 1, wherein the second voltage level is lower than the first voltage level.

3. The differential SAR ADC of claim 1, wherein the second voltage level is higher than the first voltage level.

4. The differential SAR ADC of claim 1, wherein the common-mode voltage control circuit comprises:

a first common-mode capacitor, having a first plate and a second plate, wherein the first plate of the first common-mode capacitor is coupled to the non-inverting input terminal of the comparator circuit;

a second common-mode capacitor, having a first plate and a second plate, wherein the first plate of the second common-mode capacitor is coupled to the inverting input terminal of the comparator circuit;

a first switch circuit, arranged to couple the second plate of the first common-mode capacitor to a first reference voltage during the sample phase, and couple the second plate of the first common-mode capacitor to a second reference voltage during the SAR phase, wherein the second reference voltage is different from the first reference voltage;

a second switch circuit, arranged to couple the second plate of the second common-mode capacitor to the first reference voltage during the sample phase, and couple the second plate of the second common-mode capacitor to the second reference voltage during the SAR phase; and a common-mode capacitor control logic circuit, arranged to control configurations of the first switch circuit and the second switch circuit during the sample phase and the SAR phase.

5. The differential SAR ADC of claim 4, wherein the first reference voltage is higher than the second reference voltage.

6. The differential SAR ADC of claim 4, wherein the first reference voltage is lower than the second reference voltage.

7. The differential SAR ADC of claim 1, wherein the differential SAR ADC is a top-plate sampling differential SAR ADC.

8. A differential successive approximation register (SAR) analog-to-digital conversion method, comprising:

during a sample phase of a differential SAR analog-to-digital conversion operation, sampling a differential voltage input to generate and output a differential comparator input to a comparator circuit, wherein the comparator circuit has a non-inverting input terminal and an inverting input terminal; and setting an input common-mode voltage of the comparator circuit by a first voltage level; and during a SAR phase of the differential SAR analog-to-digital conversion operation, controlling a first capacitive digital-to-analog converter (DAC) that is coupled to the non-inverting input terminal of the comparator circuit and a second capacitive DAC that is coupled to the inverting input terminal of the comparator circuit; and adjusting the input common-mode voltage of the comparator circuit to have a second voltage level, wherein the second voltage level is different from the first voltage level.

9. The differential SAR analog-to-digital conversion method of claim 8, wherein the second voltage level is lower than the first voltage level.

10. The differential SAR analog-to-digital conversion method of claim 8, wherein the second voltage level is higher than the first voltage level.

11. The differential SAR analog-to-digital conversion method of claim 8, wherein a first plate of a first common-mode capacitor is coupled to the non-inverting input terminal of the comparator circuit, and a first plate of a second common-mode capacitor is coupled to the inverting input terminal of the comparator circuit; setting the input common-mode voltage of the comparator circuit by the first voltage level comprises:

coupling a second plate of the first common-mode capacitor to a first reference voltage; and coupling a second plate of the first common-mode capacitor to the first reference voltage;

adjusting the input common-mode voltage of the comparator circuit to have the second voltage level comprises:

coupling the second plate of the first common-mode capacitor to a second reference voltage, wherein the second reference voltage is different from the first reference voltage; and coupling the second plate of the first common-mode capacitor to the second reference voltage.

12. The differential SAR analog-to-digital conversion method of claim 11, wherein the first reference voltage is higher than the second reference voltage.

13. The differential SAR analog-to-digital conversion method of claim 11, wherein the first reference voltage is lower than the second reference voltage.

14. The differential SAR analog-to-digital conversion method of claim 8, wherein the differential SAR analog-to-digital conversion method employs a top-plate sampling technique.

* * * * *